US010312860B2

United States Patent
Stenman et al.

(10) Patent No.: US 10,312,860 B2
(45) Date of Patent: Jun. 4, 2019

(54) REDUCING DURATION OF START-UP PERIOD FOR A CRYSTAL OSCILLATOR CIRCUIT

(71) Applicant: Telefonaktiebolaget LM Ericsson (publ), Stockholm (SE)

(72) Inventors: Anna Karin Stenman, Hjärup (SE); Stefanos Stefanidis, Graz (AT); Lars Sundström, Södra Sandby (SE); Tahmineh Torabian Esfahani, Linköping (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 281 days.

(21) Appl. No.: 15/030,646

(22) PCT Filed: Mar. 13, 2015

(86) PCT No.: PCT/EP2015/055363
§ 371 (c)(1),
(2) Date: Apr. 20, 2016

(87) PCT Pub. No.: WO2016/146154
PCT Pub. Date: Sep. 22, 2016

(65) Prior Publication Data
US 2018/0198411 A1  Jul. 12, 2018

(51) Int. Cl.
*H03B 1/04* (2006.01)
*H03B 5/02* (2006.01)
*H03B 5/06* (2006.01)
*H03B 5/12* (2006.01)
*H03B 5/36* (2006.01)
*H03L 7/093* (2006.01)

(52) U.S. Cl.
CPC .............. *H03B 5/364* (2013.01); *H03B 1/04* (2013.01); *H03B 5/02* (2013.01); *H03B 5/06* (2013.01);
(Continued)

(58) Field of Classification Search
CPC . H03B 5/06; H03B 5/36; H03B 5/364; H03B 5/1228; H03B 5/02; H03B 5/1215;
(Continued)

(56) References Cited

U.S. PATENT DOCUMENTS 5,805,027 A    9/1998  Yin
6,657,501 B1  12/2003  Anil et al.
(Continued)

FOREIGN PATENT DOCUMENTS

EP    1681768 A1    7/2006

OTHER PUBLICATIONS

Xianwen, Z. et al., "A Fast Start-up, Low-Power Differential Crystal Oscillator for DRM/DAB Receiver", 12th IEEE International Conference on Communication Technology (ICCT), Nov. 11, 2010, pp. 1027-1030, IEEE.
(Continued)

*Primary Examiner* — Arnold M Kinkead
(74) *Attorney, Agent, or Firm* — Coats & Bennett, PLLC

(57) ABSTRACT

A crystal oscillator circuit comprises a crystal; oscillator circuitry for generating a crystal oscillation signal at an oscillation frequency; and a kick-start circuit for injecting pulses into the crystal during a start-up period. The oscillator circuitry comprises a differential pair of transistors and can operate in an oscillating mode or a start-up mode. In the oscillating mode, the differential pair of transistors are cross-coupled so that a gate terminal of one transistor is coupled to a drain terminal of the other transistor, and vice versa, and the drain terminals are coupled to the crystal to generate the crystal oscillation signal. In the start-up mode, the kick-start circuit drives the gate terminals of the transistors with said pulses. This crystal oscillator circuit has a decreased start-up time compared to prior art solutions and a reduced influence of parasitic oscillations.

19 Claims, 12 Drawing Sheets

(52) U.S. Cl.
CPC ......... *H03B 5/1215* (2013.01); *H03B 5/1228* (2013.01); *H03L 7/093* (2013.01); *H03B 2200/0094* (2013.01)

(58) Field of Classification Search
CPC .............. H03B 1/04; H03B 2200/0094; H04B 5/0075; H04B 5/0087; H04B 7/24; H03L 7/091; H03L 7/00; H03L 7/0802; H03L 7/081; H03L 7/093
USPC .................................. 331/158, 116 R, 116 FE
See application file for complete search history.

(56) References Cited

U.S. PATENT DOCUMENTS

| | | | |
|---|---|---|---|
| 6,819,195 | B1 | 11/2004 | Blanchard et al. |
| 7,009,458 | B2 * | 3/2006 | Gazit ..................... H03B 5/06 331/116 FE |
| 8,736,391 | B2 | 5/2014 | Huang et al. |
| 2002/0190802 | A1 | 12/2002 | Ruffieux |
| 2005/0083139 | A1 | 4/2005 | Gazit |
| 2006/0071729 | A1 | 4/2006 | Cetin et al. |
| 2006/0071829 | A1 | 4/2006 | Cetin et al. |
| 2006/0170509 | A1 | 8/2006 | Christ |
| 2007/0247247 | A1 | 10/2007 | Mosesov |
| 2009/0015342 | A1 | 1/2009 | Kleveland |
| 2009/0021317 | A1 | 1/2009 | Hsieh |
| 2010/0206074 | A1 | 8/2010 | Yoshida et al. |
| 2011/0037527 | A1 | 2/2011 | Shrivastava et al. |
| 2014/0266474 | A1 | 9/2014 | Schlarmann et al. |

OTHER PUBLICATIONS

Vittoz, E. et al., "High-Performance Crystal Oscillator Circuits: Theory and Application", IEEE Journal of Solid-State Circuits, Jun. 1, 1988, pp. 774-783, vol. 23, No. 3, IEEE.

* cited by examiner

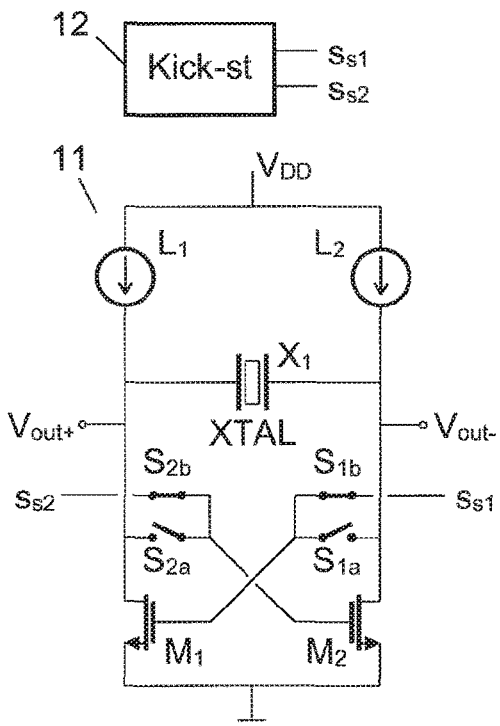
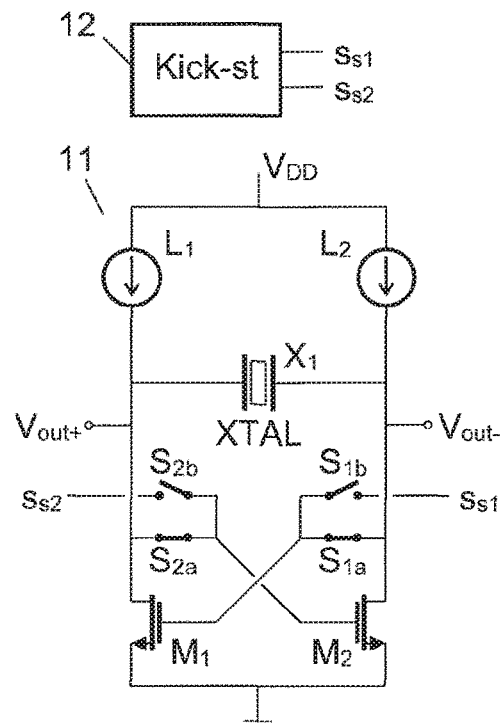
Fig. 6a    Fig. 6b
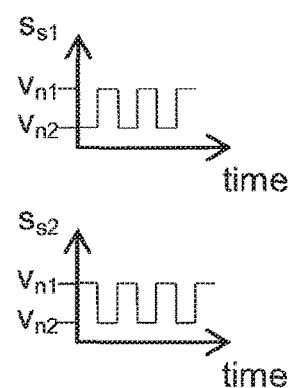
Fig. 7

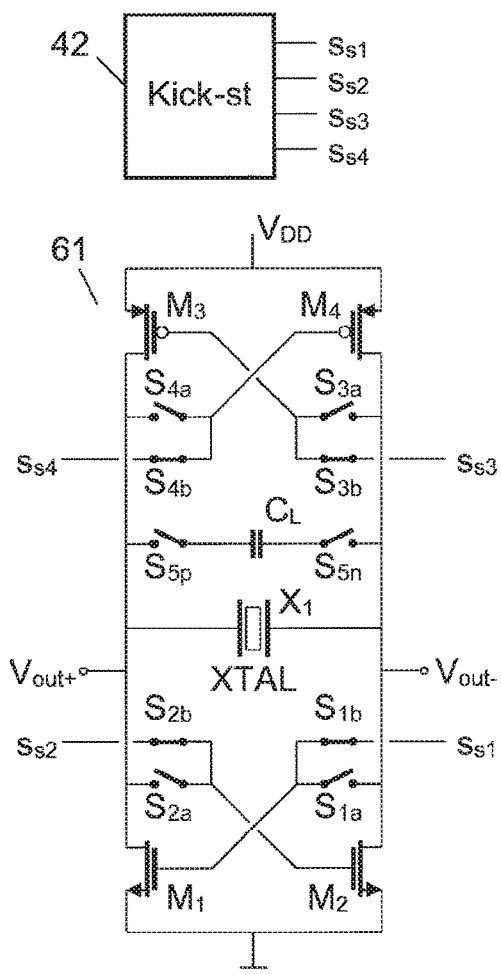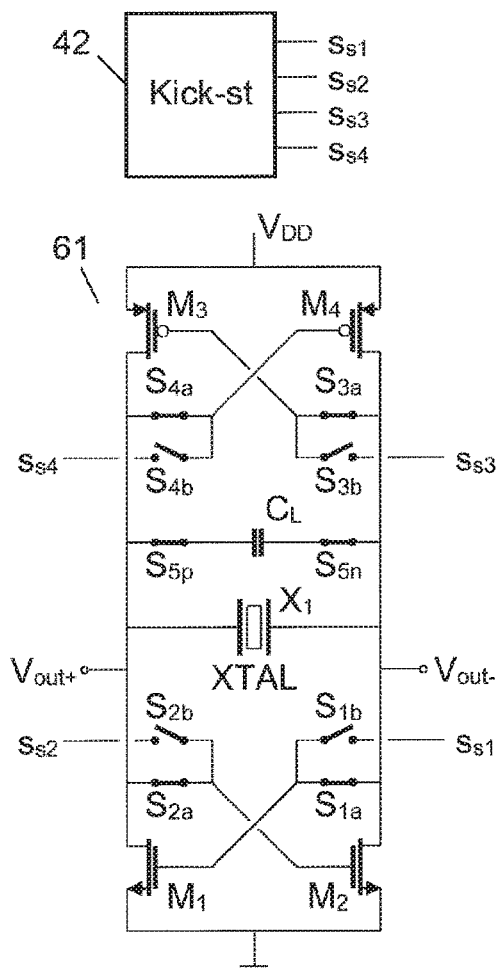
Fig. 18a    Fig. 18b
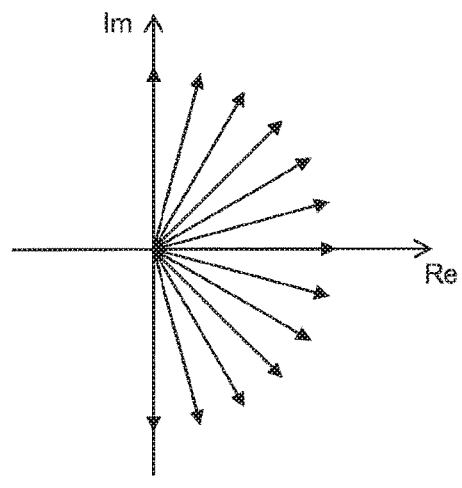
Fig. 19

REDUCING DURATION OF START-UP PERIOD FOR A CRYSTAL OSCILLATOR CIRCUIT

TECHNICAL FIELD

The invention relates to a crystal oscillator circuit comprising a crystal, oscillator circuitry to generate a crystal oscillation signal and a kick-start circuit, an electronic apparatus comprising at least one such crystal oscillator circuit, and a method of reducing the duration of a start-up period for a crystal oscillator circuit.

BACKGROUND

Wireless communication technologies continue to evolve to meet the demand for increased data throughput. This is addressed on many levels with different approaches including higher order modulation, multiple-input and multiple-output (MIMO), scheduling, increased bandwidth, and so on. In particular, higher carrier frequencies than commonly used today have attracted a lot of interest, as there are larger blocks, e.g. up to several GHz, of continuous spectra available. Especially, the use of radio frequencies in the Extremely High Frequency (EHF) band seems interesting, i.e. frequencies in the range from 30 to 300 GHz. Radio waves in this band have wavelengths from ten to one millimeter, and thus the band is also called millimeter band or millimeter wave, abbreviated as the mmW frequency band. A mmW-based air interface is considered to be one important component of a forthcoming 5G standard. Already today, there is an amendment to the Wi-Fi standard, 802.11ad, which specifies operation in the 60 GHz range with a channel bandwidth of 2.16 GHz.

For the purpose of up-conversion of signals from baseband or intermediate frequencies to said higher carrier frequency and down-conversion from said higher carrier frequency to baseband or intermediate frequencies there is a need for a circuit for generation of a local oscillator (LO) signal, typically in the form of a phase-locked loop (PLL). The PLL in turn requires a reference signal, usually obtained from a crystal oscillator (XO).

As the carrier frequency and signal bandwidth are increased, the duration of frame structure elements is preferably reduced correspondingly, especially when taking a larger leap in carrier frequency, e.g. from 5 GHz to 60 GHz. This has the advantage of giving lower latency in the transmission as well keeping the smallest non-divisible transmission unit (for example an Orthogonal Frequency Division Multiplexing (OFDM) symbol) reasonable sized in terms of number of bits it holds. For example, 802.11n/ac operates at the 2.4 and 5 GHz ISM (industrial, scientific and medical) bands, and for those carrier frequency ranges one OFDM period is 3.2 µs in length excluding guard interval. For 802.11ad operating in the 60 GHz range, the OFDM period is 0.194 µs.

With smaller transmission units, the ability of various blocks in a transceiver (including phase-locked loops and crystal oscillators) to power up and down fast needs to increase correspondingly, especially in battery-operated equipment where powering up and down blocks as needed is a prerequisite for reasonable battery time.

A phase-locked loop operating at cellular frequencies, say around 2 GHz, may take some 100 µs to reach a stable output frequency from cold start. A crystal oscillator may take several milliseconds. In LTE (Long Term Evolution), one OFDM period is roughly 67 µs, and 14 of those compose a sub-frame of 1 ms (including cyclic prefix). Thus, the power up time for the PLL and XO is roughly within the range of an OFDM symbol and sub-frame.

For PLLs operating in the mmW range it can be argued that also the frequency of the crystal oscillator should be increased from that typically used in today's cellular equipment (e.g. 52 MHz), the reason being that the phase noise of the XO gets "amplified" as 20 log $10(f_{LO}/f_{XO})$. There exists crystal oscillators operating at up to around 500 MHz based on crystal resonators. A positive side effect is that the power up time will decrease.

The duration of transmission units (e.g. OFDM symbol and frame duration) will decrease substantially for forthcoming 5G mmW-based transmission schemes. Keeping the power-up transition time of today's solution will cause the energy drawn by the XO during start-up to surpass that of the energy used during actual reception and transmission. In addition to this, as the crystal oscillator needs to operate at a higher frequency it will also draw more power thus eroding the short power up time of a high frequency crystal oscillator. For example, a ~500 MHz XO can draw 5-10 times the current of a ~50 MHz XO depending on phase noise requirements, start-up time etc. In other words, the problem with existing solutions is that power-up time of crystal oscillators is too high.

Another problem is that crystal oscillator architectures often suffer from the risk of parasitic oscillation.

A differential crystal oscillator circuit is described in US 2010/026402. This circuit uses a differential pair of transistors operating to produce a differential output over a crystal so that an oscillation frequency is established at the differential output of the circuit.

Some solutions have been suggested with the purpose of reducing the start-up time of a crystal oscillator. Some circuits have different biasing conditions for start-up and regular operation, while others try to improve start-up of oscillation by temporarily increasing negative resistance of a feedback circuit. However, such solutions have only shown a limited effect that is not sufficient for the high frequencies described above.

It has also been suggested to inject a current pulse into the crystal causing it to start oscillating. Although this has a certain effect on the start-up time, it is still far from being sufficient.

US 2005/083139 describes a system in which a single ended oscillator circuit can operate in two configurations. In a first configuration, the crystal is connected between a ground terminal and a low-Q wake-up oscillator that applies a series of pulses to the crystal. The low-Q wake-up oscillator can be e.g. an RC Schmidt-trigger based oscillator that wakes up within one pulse. In a second configuration, the crystal is connected in a closed loop with an internal amplifier and operating as a steady state oscillator. This provides a faster wake-up of the crystal oscillator, but the use of a single ended oscillator is less suitable for the present application, e.g. due to problems with phase noise and parasitic oscillations. Single-ended oscillators are normally also more sensitive to interference, and generate more interference than differential ones. Further, this circuit is not suitable for the high frequencies needed in the applications mentioned above.

SUMMARY

Therefore, it is an object of embodiments of the invention to provide a crystal oscillator circuit that is suitable for use in local oscillator circuits in transceivers operating in e.g. the mmW frequency band, and which has a considerably decreased start-up time compared to prior art solutions in combination with a reduced influence of parasitic oscillations.

According to embodiments of the invention the object is achieved in a crystal oscillator circuit comprising a crystal; oscillator circuitry connected to said crystal and configured to generate a crystal oscillation signal at an oscillation frequency; and a kick-start circuit configured to inject a number of pulses into said crystal during a start-up period of the crystal oscillator circuit. The object is achieved when said oscillator circuitry comprises a first differential pair of transistors and is configured to operate in a selectable one of at least an oscillating mode and a start-up mode, wherein the first differential pair of transistors, in the oscillating mode, are cross-coupled so that a gate terminal of a first transistor of the first differential pair is coupled to a drain terminal of a second transistor of the first differential pair, and a gate terminal of the second transistor of the first differential pair is coupled to a drain terminal of the first transistor of the first differential pair, each one of said drain terminals of the first and second transistors of the first differential pair further being coupled to a terminal of said crystal to generate said crystal oscillation signal at said oscillation frequency; and said kick-start circuit, in the start-up mode, is configured to drive the gate terminals of said first and second transistors of the first differential pair with said number of pulses during said start-up period of the crystal oscillator circuit.

Oscillator circuitry with a differential pair of cross-coupled transistors allows the crystal oscillator circuit to operate at the desired high frequencies, and when start-up pulses are injected into the crystal by driving the gate terminals of the cross-coupled transistors in a start-up mode, the start-up time of the crystal oscillator circuit is substantially decreased, and parasitic oscillations in the crystal oscillator circuit can be avoided or at least considerably reduced. Decreased time for start-up leads to lower power consumption, which will be increasingly important as the frequency of the crystal oscillator approaches the GHz regime.

In some embodiments, the crystal oscillator circuit is further configured to disconnect, in the start-up mode, the gate terminal of the first transistor of the first differential pair from the drain terminal of the second transistor of the first differential pair, and the gate terminal of the second transistor of the first differential pair from the drain terminal of the first transistor of the first differential pair.

The oscillator circuitry may further comprise a second differential pair of transistors, said second differential pair of transistors being complementary to the first differential pair of transistors, wherein the second differential pair of transistors, in the oscillating mode, are cross-coupled so that a gate terminal of a first transistor of the second differential pair is coupled to a drain terminal of a second transistor of the second differential pair, and a gate terminal of the second transistor of the second differential pair is coupled to a drain terminal of the first transistor of the second differential pair, each one of said drain terminals of the first and second transistors of the second differential pair further being coupled to a terminal of said crystal to generate said crystal oscillation signal at said oscillation frequency. The use of a complementary cross-coupled differential pair of transistors reuses the same current as the first cross-coupled pair of transistors to generate negative resistance in the circuit.

In this case, said kick-start circuit may, in the start-up mode, be configured to drive the gate terminals of said first and second transistors of the second differential pair with said number of pulses during said start-up period of the crystal oscillator circuit, and the crystal oscillator circuit may further be configured to disconnect, in the start-up mode, the gate terminal of the first transistor of the second differential pair from the drain terminal of the second transistor of the second differential pair, and the gate terminal of the second transistor of the second differential pair from the drain terminal of the first transistor of the second differential pair.

In some embodiments, each transistor of said differential pair of transistors comprises a field effect transistor.

In some embodiments, said kick-start circuit comprises an oscillator dedicated to generating said number of pulses. In such case, the dedicated oscillator may be a free-running oscillator, and the free-running oscillator may be configured to be calibrated by being phase locked to said oscillator circuitry during a time period where the oscillator circuitry is operating in the oscillating mode. In this way, a kick-start circuit having a frequency close to the target frequency of the crystal oscillator can be achieved. Alternatively, the dedicated oscillator may be configured to be locked to an external reference frequency, which also ensures a good accuracy of frequency of the kick-start circuit.

When a capacitor is arranged in parallel to said crystal for adjustment of said oscillation frequency when the oscillator circuitry is operating in the oscillating mode, the crystal oscillator circuit may further be configured to disconnect said capacitor from the crystal in the start-up mode. When the load capacitance used for pulling control and tuning is disconnected from the crystal oscillator output terminals during the start-up, it can be avoided that this capacitance sinks a large amount of current foremost yielding significant dynamic power consumption, but also effectively lowering the voltage across the crystal and thereby slowing energy injection.

In some embodiments, the crystal oscillator circuit is further configured to determine said number of pulses in dependence of a difference in frequency between a frequency of said pulses and an oscillation frequency of an oscillation generated in said crystal by injecting said pulses into said crystal. In this way an optimal number of pulses, and thus an optimal duration of the start-up mode, can be determined.

The crystal oscillator circuit may be configured to determine said number of pulses so that a phase difference between each one of said pulses and the oscillation signal generated in said crystal by injecting that one and previous pulses of said number of pulses into said crystal is between $-\pi/2$ and $\pi/2$.

The crystal oscillator circuit may further be configured to inject at least a further number of pulses into said crystal during a further start-up period of the crystal oscillator circuit, wherein a phase difference between pulses of said further start-up period and said crystal oscillation signal is between $-\pi/2$ and $\pi/2$, said start-up periods being separated by a time period where said phase difference exceeds $\pi/2$.

An electronic apparatus may comprise at least one crystal oscillator circuit as described above. In this way, the apparatus benefits from the described advantages of the crystal oscillator circuit. The electronic apparatus may be a wireless communications device comprising a receiver or a transmitter for radio frequency signals. In one embodiment, the wireless communications device is a base station for a wireless communications system. In another embodiment, the wireless communications device is a mobile phone use in a wireless communications system.

As mentioned, the invention further relates to a method of reducing the duration of a start-up period for a crystal oscillator circuit comprising a crystal; and oscillator circuitry connected to said crystal and configured to generate a crystal oscillation signal at an oscillation frequency, said oscillator circuitry comprising a first differential pair of transistors, wherein the first differential pair of transistors, in an oscillating mode, are cross-coupled so that a gate terminal of a first transistor of the first differential pair is coupled to a drain terminal of a second transistor of the first differential pair, and a gate terminal of the second transistor of the first differential pair is coupled to a drain terminal of the first transistor of the first differential pair, each one of said drain terminals of the first and second transistors of the first differential pair further being coupled to a terminal of said crystal to generate said crystal oscillation signal at said oscillation frequency; wherein the method comprises the step of injecting from a kick-start circuit a number of pulses into said crystal during a start-up period of the crystal oscillator circuit, said pulses being injected by driving the gate terminals of said first and second transistors of the first differential pair with said number of pulses during said start-up period of the crystal oscillator circuit.

Oscillator circuitry with a differential pair of cross-coupled transistors allows the crystal oscillator circuit to operate at the desired high frequencies, and when a number of start-up pulses are injected into the crystal by driving the gate terminals of the cross-coupled transistors in a start-up mode, the start-up time of the crystal oscillator circuit is substantially decreased, and parasitic oscillations in the crystal oscillator circuit can be avoided or at least considerably reduced. Decreased time for start-up leads to lower power consumption, which will be increasingly important as the frequency of the crystal oscillator approaches the GHz regime.

BRIEF DESCRIPTION OF THE DRAWINGS

Embodiments of the invention will now be described more fully below with reference to the drawings, in which

FIGS. 6a and 6b show an embodiment of a crystal oscillator having a cross-coupled core that can be driven by a kick-start circuit during a start-up phase;

FIG. 7 shows control signals generated by the kick-start circuit of FIGS. 6a and 6b;

FIGS. 18a and 18b show an embodiment of a crystal oscillator having a cross-coupled core and a complementary cross-coupled core that can be driven by a kick-start circuit during a start-up phase, and which can further disconnect a frequency pulling capacitor;

FIG. 19 illustrates the phase relationship between kick-start pulses and the oscillation generated in a crystal;

DETAILED DESCRIPTION

Figure 1:
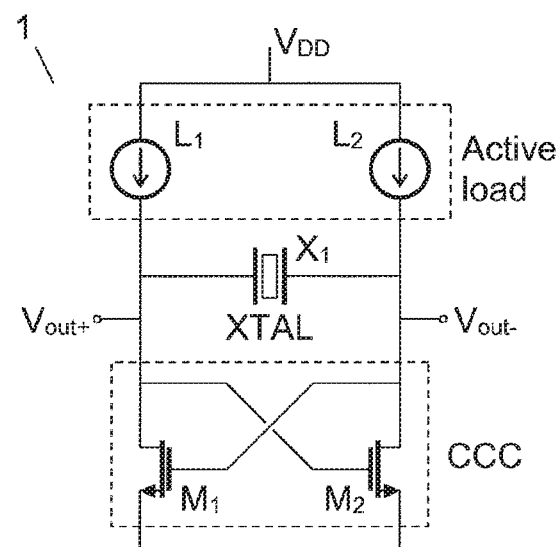
FIG. 1 shows a basic configuration of a crystal oscillator having a cross-coupled core.

FIG. 1 shows an example of a basic configuration of a crystal oscillator 1 comprising a crystal or crystal resonator $X_1$ (XTAL) and a control circuit or oscillator circuitry arranged to maintain oscillations in the oscillator by amplifying a voltage signal over the crystal resonator and feeding it back to the crystal. Crystal oscillators are typically integrated with transceiver chips on which they are used, so that only the crystal resonator itself is external, while the remaining part, the crystal oscillator core, is part of the chip. Further, such crystal oscillators often employ a differential architecture as the one shown in FIG. 1.

FIG. 1 is a simplified view disregarding some circuitry needed to ensure proper operating point. A cross coupled core (CCC) of two transistors $M_1$ and $M_2$ provides a negative resistance to compensate for the losses in the crystal resonator $X_1$ and other losses associated with the nodes of the crystal as to ensure successful start of oscillation as well as maintaining the oscillation. The source terminals of transistors $M_1$ and $M_2$ are coupled to a ground terminal, while the drain terminals are coupled to the two terminals of the crystal $X_1$. The transistors $M_1$ and $M_2$ are cross-coupled in that the gate terminal of each transistor is coupled to the drain terminal of the opposite transistor, thus providing positive feedback driving the crystal $X_1$ to oscillate at its resonance frequency. An active load is represented by the current sources $L_1$ and $L_2$ connected to a positive supply voltage $V_{DD}$. An output signal from the oscillator is provided from the output terminals $V_{out+}$ and $V_{out-}$. In FIG. 1, each one of the transistors $M_1$ and $M_2$ is implemented as an n-type MOSFET (Metal-Oxide Semiconductor Field Effect Transistor), which may also be designated as an NMOS device. However, other transistor types, such as bipolar transistors, could be used as well. As mentioned, FIG. 1 is a simplified view disregarding some circuitry needed to ensure proper operating point, such as biasing circuitry or components as those illustrated in FIGS. 4 and 5 described below.

During start-up of the oscillator, any tiny fraction of noise around the resonance frequency of the crystal will, due to the positive feedback of the system, start to be amplified, thus ramping up an oscillation at the resonance frequency. However, this normal way of start-up takes a certain time before a stable oscillation is available at the oscillator circuit outputs. This relative long start-up time is unacceptable in the present application of the oscillator circuit.

Such a crystal oscillator generally has an over-provisioning of negative resistance to provide successful operation over all process, voltage, and temperature conditions (PVT) and to control the start-up time, i.e. the time from activation/power-up to stable output (with respect to amplitude and frequency).

Figure 2:
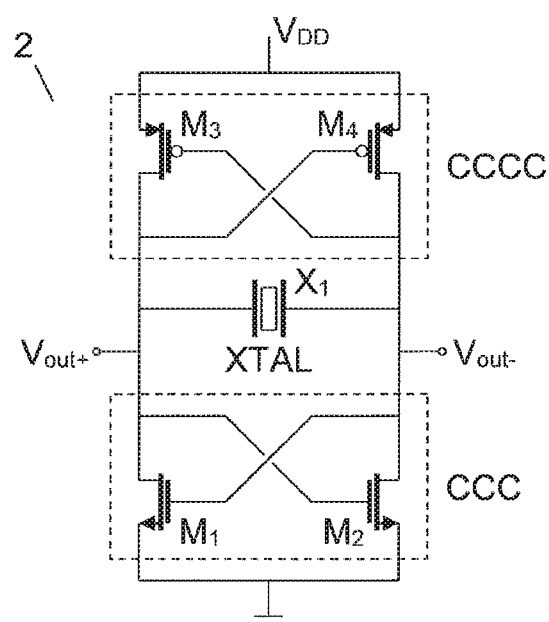
FIG. 2 shows a basic configuration of a crystal oscillator having a cross-coupled core and a complementary cross-coupled core.

A variant of the basic crystal oscillator architecture in FIG. 1 is shown as the crystal oscillator 2 in FIG. 2. Instead of having an active load towards $V_{DD}$, there is now a complementary cross-coupled core (CCCC) of two transistors $M_3$ and $M_4$. This is a current-reuse architecture as the CCCC uses the same current as the CCC to generate negative resistance. The penalty may be somewhat larger parasitic capacitance from the CCCC as it is implemented with PMOS devices that need to have approximately 3 times the width of the NMOS devices in the CCC to generate the same amount of negative resistance.

Most crystal oscillator architectures suffer from the risk of parasitic oscillation, i.e. that the conditions for oscillations are also fulfilled for other frequencies than the desired. This may also be the case for the circuits of FIGS. 1 and 2, as it will be exemplified below with reference to FIGS. 3 to 5 by considering different biasing solutions. However, other aspects may further complicate the picture in this regard, including effects of package, wires on the printed circuit board used to connect the crystal and the chip etc.

Figure 3:
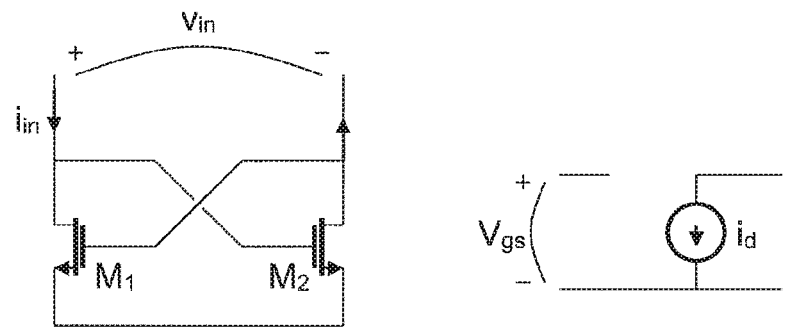
FIG. 3 illustrates the properties of a general cross-coupled core.

First, FIG. 3 illustrates the properties of a general cross-coupled core (CCC) as it may be used in voltage-controlled oscillators (with an LC resonance circuit). In this case, the biasing of the gate is given by the DC path in the coil (not shown). FIG. 3 illustrates the core and a small signal model of each transistor. The admittance of the core with two transistors $M_1$ and $M_2$ is given by $$Y_{in} = \frac{i_{in}}{v_{in}} = -\frac{g_{in}}{2},$$

where $g_m$ is the transconductance of each transistor, i.e. $i_d/V_{gs}$ (small signal). This architecture is not possible to use in crystal oscillators as it will lead to a DC bistable solution. This does not happen in an LC-based VCO as the inductor (L) has a center-tap to e.g. the voltage supply ($V_{DD}$), which will inhibit the bistable state.

Figure 4:
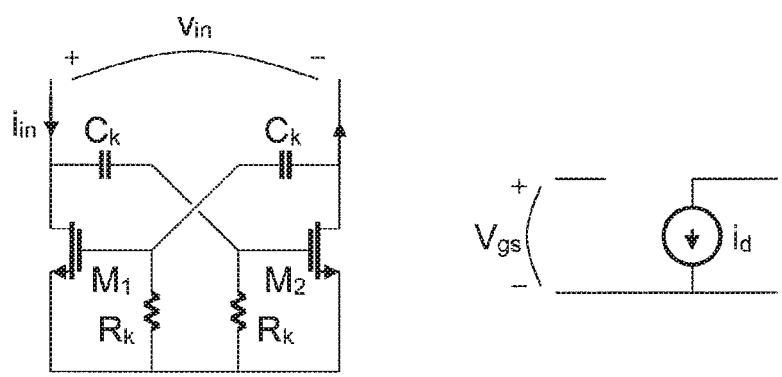
FIG. 4 illustrates the properties of a cross-coupled core with high-pass feedback.

FIG. 4 illustrates the properties of a cross coupled core with high-pass feedback. In this crystal oscillator CCC the DC path in the CCC is cut and the biasing has to be given from an external reference, while the oscillating frequency signal is fed back to the gate terminals. FIG. 4 illustrates the core with high-pass feedback and a small signal model of each transistor. The admittance is given by $$Y_{in} = \frac{i_{in}}{v_{in}} =$$
$$-\frac{1}{2} \cdot \frac{j\omega C_k R_k (1 - j\omega C_k R_k)}{1 + \omega^2 C_k^2 R_k^2}(g_m + j\omega C_k) + \frac{1}{2}j\omega C_k = [\tau_k = C_k R_k] ==$$
$$\frac{1}{2}\left(-g_m + \frac{1}{R_k}\right)\frac{\omega^2 \tau_k^2}{1 + \omega^2 \tau_k^2} + \frac{1}{2}\left(-g_m + \frac{1}{R_k}\right)\frac{j\omega \tau_k}{1 + \omega^2 \tau_k^2}.$$

As seen in the equation there is not only a negative conductance but a negative susceptance as well, giving that the core provides an inductance that can oscillate with the capacitance load, resulting in a potential parasitic oscillation frequency.

Figure 5:
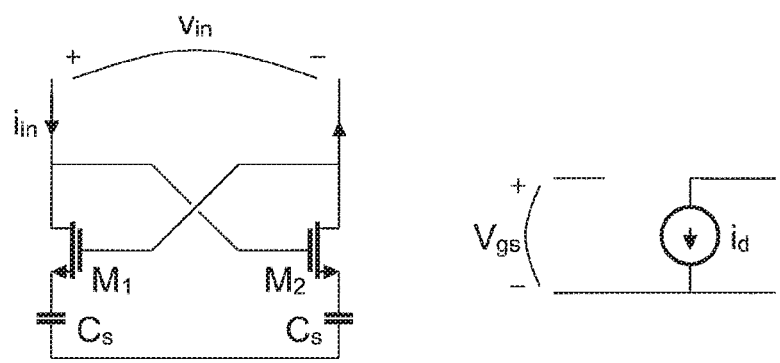
FIG. 5 illustrates the properties of a cross-coupled core with capacitive degeneration.

FIG. 5 illustrates the properties of a cross coupled core with capacitive degeneration. In this crystal oscillator CCC the DC path in the crystal is again cut, but the voltage bias is given from the drain output, which can be biased from an external reference. FIG. 5 illustrates the core with capacitive source degeneration and a small signal model of each transistor. The admittance is given by $$\frac{i_{in}}{v_{in}} = -\frac{1}{2} \cdot \frac{1}{\frac{1}{g_m} + \frac{1}{j\omega C_s}} = -\frac{1}{2} \cdot \frac{j\omega C_s g_m (g_m - j\omega C_s)}{g_m^2 + \omega^2 C_s^2} =$$
$$-\frac{g_m}{2}\frac{\omega^2 C_s^2}{g_m^2 + \omega^2 C_s^2} - \frac{j\omega C_s}{2}\frac{g_m^2}{g_m^2 + \omega^2 C_s^2} == \left[\tau_s = \frac{C_s}{g_m}\right] =$$
$$-\frac{g_m}{2}\frac{\omega^2 \tau_s^2}{1 + \omega^2 \tau_s^2} - \frac{j\omega C_s}{2}\frac{1}{1 + \omega^2 \tau_s^2} = -\frac{g_m}{2}\frac{\omega^2 \tau_s^2}{1 + \omega^2 \tau_s^2} - \frac{g_m}{2}\frac{j\omega \tau_s}{1 + \omega^2 \tau_s^2}$$

As seen in the equation there is not only a negative conductance but a negative susceptance as well, giving that the core provides an inductance that can oscillate with the capacitance load, again resulting in a potential parasitic oscillation frequency.

Thus it can be seen that crystal oscillator architectures often suffer from the risk of parasitic oscillation. Circuits in FIGS. 4 and 5 can have a configuration of capacitance and resistance that removes the parasitic oscillation, but it comes at the cost of reduced transconductance, or in other words loss of negative resistance.

Below a solution is proposed for ensuring a much faster start-up of the crystal oscillator circuit and at the same time reducing the risk of parasitic oscillations during the start-up phase. The proposed startup circuit is based on using a second source of signal (kick-start circuit) to alternatingly switch the transistors of the cross-coupled core so as to pump energy into the tank of the crystal oscillator. The proposed solution uses a large signal momentarily forcing a reduction of the influence of the parasitic oscillation created by the cross-coupled core itself.

FIGS. 6a and 6b show an embodiment, implemented as the oscillator circuitry 11 driven by a kick-start circuit 12, of how the crystal oscillator circuit of FIG. 1 can be configured for fast start-up. To control the start-up process, the circuit comprises switches $S_{1a}$, $S_{2a}$, $S_{1b}$ and $S_{2b}$. In FIG. 6a illustrating the crystal oscillator circuit during a start-up phase, switches $S_{1a}$ and $S_{2a}$ are open to break the normal feedback path from the oscillator outputs to the gate terminals of transistors $M_1$ and $M_2$, while switches $S_{1b}$ and $S_{2b}$ are closed to enable the kick-start circuit 12 to drive the gate terminals of transistors $M_1$ and $M_2$ with control signals $s_{s1}$ and $s_{s2}$. These control signals $s_{s1}$ and $s_{s2}$ generated by the kick-start circuit 12 have a frequency roughly at the target frequency of the crystal oscillator during normal operation, and as illustrated in FIG. 7, they are 180 degrees out of phase with each other.

During this start-up phase, the transistors $M_1$ and $M_2$ may be driven with a limited amplitude of the kick-start circuit output such that they stay in saturation and switch between two current levels effectively leading to an alternating current through the crystal. Alternatively, $M_1$ and $M_2$ may be driven to act as switches effectively leading to that current through the crystal will be alternating between the current from $L_1$ and $L_2$. In the latter case, where the kick-start signals drive $M_1$ and $M_2$ to act as switches, the kick-start circuit outputs may be regular digital inverters.

In FIG. 6b illustrating the crystal oscillator circuit during regular operation, i.e. when the start-up phase has been completed, switches $S_{1a}$ and $S_{2a}$ are closed to provide the normal feedback path from the oscillator outputs to the gate terminals of transistors $M_1$ and $M_2$, while switches $S_{1b}$ and $S_{2b}$ are open to disconnect the kick-start circuit 12 from the gate terminals of transistors M and $M_2$.

Figure 8A:
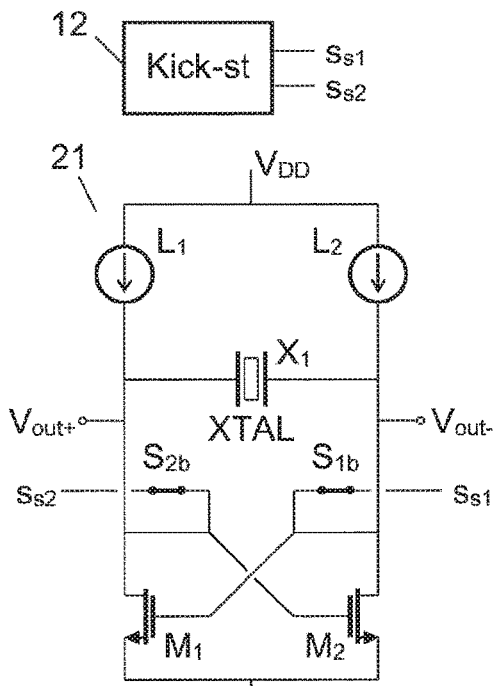
FIGS. 8a and 8b show another embodiment of a crystal oscillator having a cross-coupled core that can be driven by a kick-start circuit during a start-up phase.
Figure 8B:
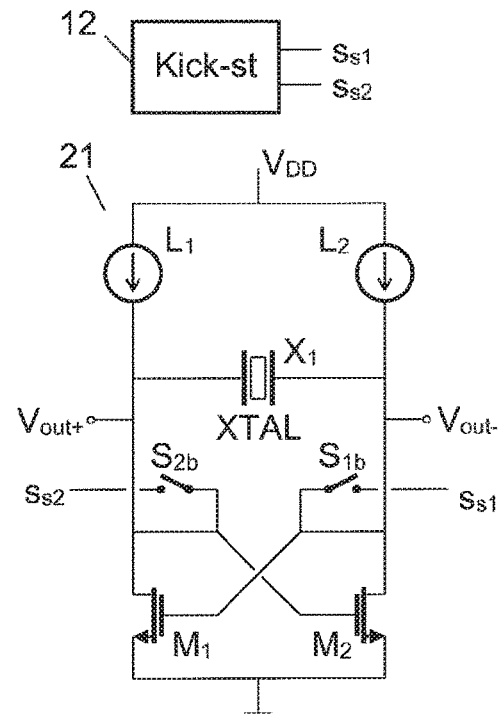

In an alternative embodiment implemented as the oscillator circuitry 21 in FIGS. 8a and 8b, switches $S_{1a}$ and $S_{2a}$ are replaced by short circuits, so that the normal feedback path from the oscillator outputs to the gate terminals of transistors $M_1$ and $M_2$ is still provided also during the start-up phase. Otherwise, the function of this circuit is the same as illustrated in FIGS. 6a and 6b.

Figure 9A:
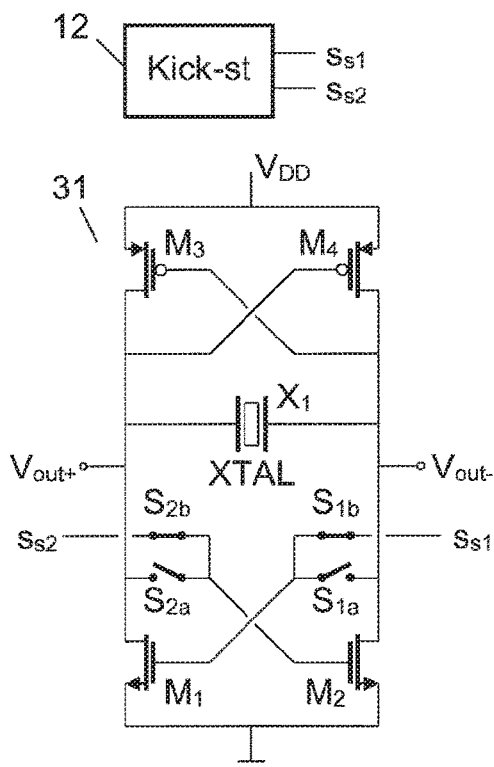
FIGS. 9a and 9b show a further embodiment of a crystal oscillator having a cross-coupled core that can be driven by a kick-start circuit during a start-up phase.
Figure 9B:
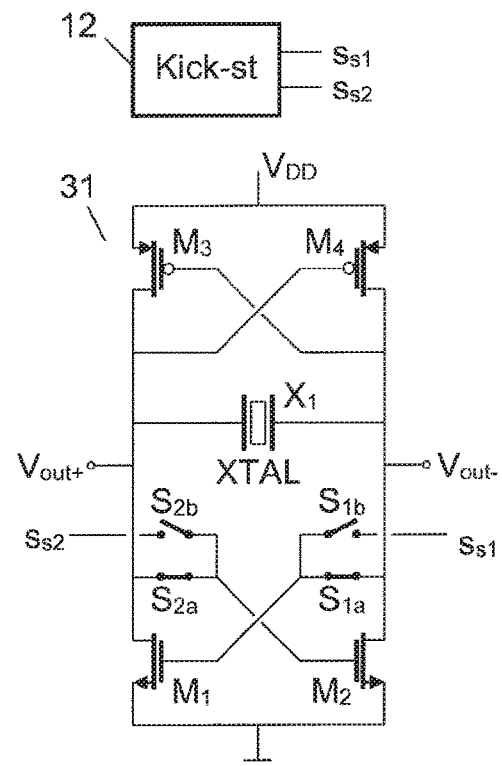

In FIGS. 9a and 9b the active load towards $V_{DD}$ represented by the current sources $L_1$ and $L_2$, as illustrated in FIGS. 1, 6a, 6b, 8a and 8b has been replaced by the complementary cross-coupled core (CCCC) of the two transistors $M_3$ and $M_4$ that was also shown in FIG. 2. Otherwise, the function of this circuit is the same as illustrated in FIGS. 6a and 6b.

Figure 10A:
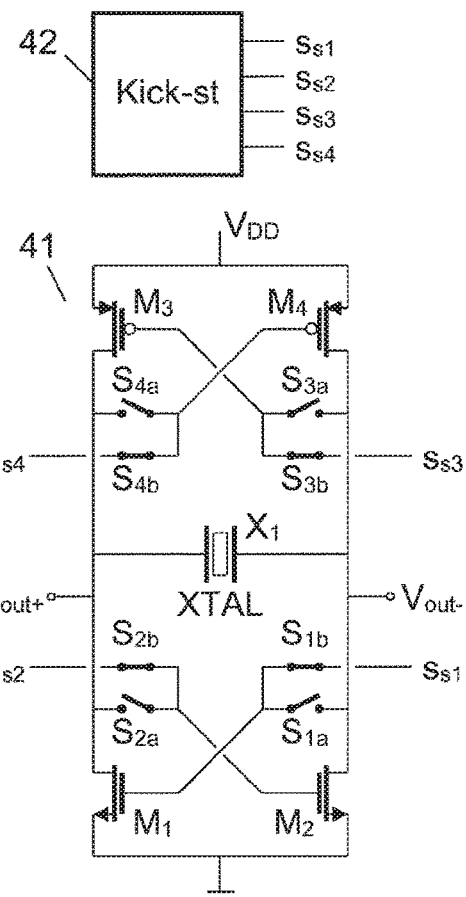
FIGS. 10a and 10b show an embodiment of a crystal oscillator having a cross-coupled core and a complementary cross-coupled core that can be driven by a kick-start circuit during a start-up phase.
Figure 10B:
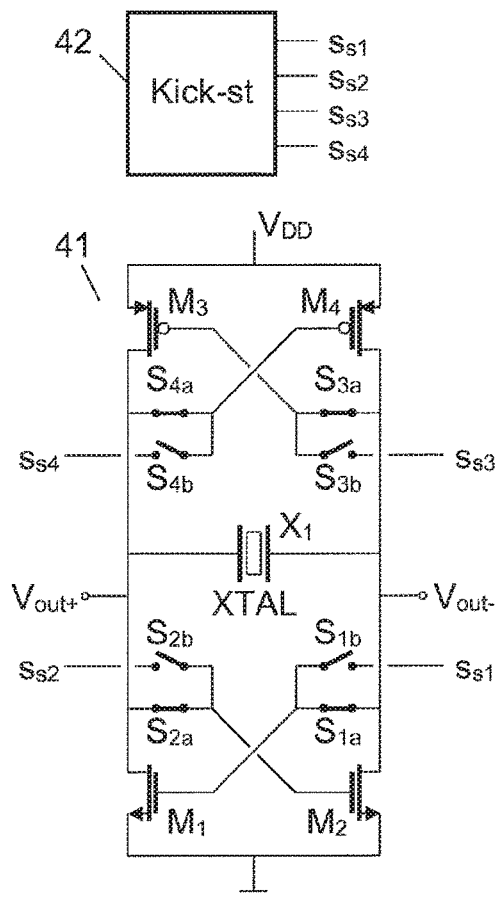

FIGS. 10a and 10b show an embodiment, in which the two transistors $M_3$ and $M_4$ are also used for injecting energy into the crystal oscillator 41, by also driving the gate terminals of these transistors with control signals from a kick-start circuit 42. To control the start-up process, the crystal oscillator circuit 41 comprises switches $S_{1a}$, $S_{2a}$, $S_{1b}$, $S_{2b}$, $S_{3a}$, $S_{4a}$, $S_{3b}$ and $S_{4b}$.

Figure 11:
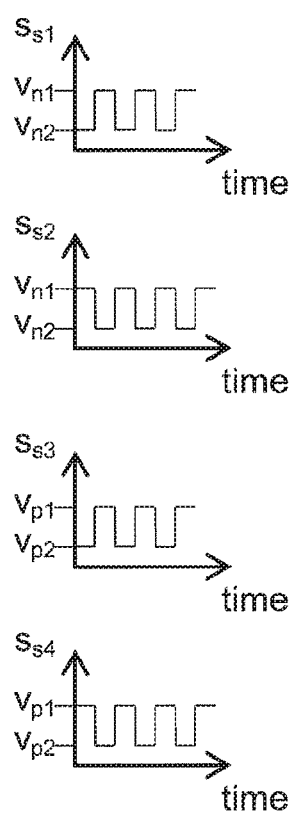
FIG. 11 shows control signals generated by the kick-start circuit of FIGS. 10a and 10b.

In FIG. 10a illustrating the crystal oscillator circuit during the start-up phase, switches $S_{1a}$, $S_{2a}$, $S_{3a}$ and $S_{4a}$ are open to break the normal feedback path from the oscillator outputs to the gate terminals of transistors $M_1$, $M_2$, $M_3$ and $M_4$, while switches $S_{1b}$, $S_{2b}$, $S_{3b}$ and $S_{4b}$ are closed to enable the kick-start circuit 42 to drive the gate terminals of transistors $M_1$, $M_2$, $M_3$ and $M_4$ with control signals $s_{s1}$, $s_{s2}$, $s_{s3}$ and $s_{s4}$. These four control signals $s_{s1}$, $s_{s2}$, $s_{s3}$ and $s_{s4}$ generated by the kick-start circuit 42 have a frequency roughly at the target frequency of the crystal oscillator during normal operation, and as illustrated in FIG. 11, signals $s_{s1}$ and $s_{s3}$ are in phase, and so are signals $s_{s2}$ and $s_{s4}$. Further, signals $s_{s1}$ and $s_{s2}$ are 180 degrees out of phase and so are signals $s_{s3}$ and $s_{s4}$. In the general case, levels $V_{n1}$ and $V_{n2}$ of signals $s_{s1}$ and $s_{s2}$ can be different from levels $V_{p1}$ and $V_{p2}$ of signals $s_{s3}$ and $s_{s4}$ as they are used to drive NMOS and PMOS devices, respectively. In the event that kick-start signals drive the transistors to act as switches, it is possible to use $V_{n1}=V_{p1}$ and $V_{n2}=V_{p2}$, and the kick-start circuit outputs may be regular digital inverters.

Also here, the transistors may, during the start-up phase, either be driven in saturation so that they switch between two current levels, or they may be driven in the triode region and thus essentially act as switches effectively alternating the crystal terminals between ground and supply.

In FIG. 10b illustrating the crystal oscillator circuit during regular operation, i.e. when the start-up phase has been completed, switches $S_{1a}$, $S_{2a}$, $S_{3a}$ and $S_{4a}$ are closed to provide the normal feedback path from the oscillator outputs to the gate terminals of transistors $M_1$, $M_2$, $M_3$ and $M_4$, while switches $S_{1b}$, $S_{2b}$, $S_{3b}$ and $S_{4b}$ are open to disconnect the kick-start circuit 42 from the gate terminals of transistors $M_1$, $M_2$, $M_3$ and $M_4$.

Also in this embodiment, switches $S_{1a}$, $S_{2a}$, $S_{3a}$ and $S_4$a may be replaced by short circuits, so that the normal feedback path from the oscillator outputs to the gate terminals of transistors $M_1$, $M_2$, $M_3$ and $M_4$ is still provided also during the start-up phase.

The embodiments above are based on a kick-start circuit 12 or 42 that provides periodic square-wave signals. In the general case, however, the signals do not need to be periodic, but must at least have power around the target frequency of the crystal oscillator to be able to charge the oscillator tank with energy. There are a number of possibilities with respect to the source of the kick-start signal.

Figure 12:
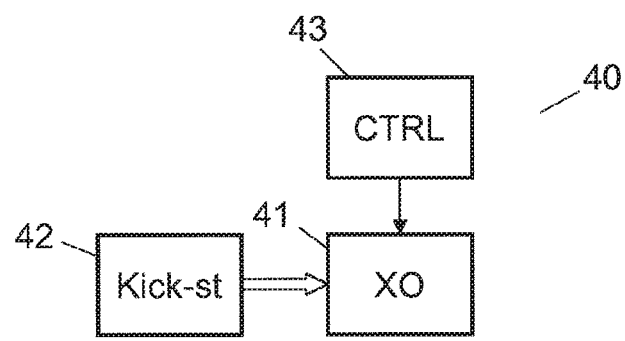
FIG. 12 shows a crystal oscillator circuit having a kick-start circuit with a free-running dedicated oscillator.

FIG. 12 shows a crystal oscillator circuit 40 using a dedicated kick-start oscillator 42 as described above for providing a relatively inaccurate (compared to crystal of crystal oscillator) frequency, e.g. a (free-running) ring oscillator, an LC-oscillator, or a relaxation oscillator to the crystal oscillator 41. A control circuit 43 controls the switches $S_{1a}$, $S_{2a}$, $S_{3a}$, $S_{4a}$, $S_{1b}$, $S_{2b}$, $S_{3b}$ and $S_{4b}$ of the crystal oscillator 41, and thus also the duration of the start-up phase.

Figure 13:
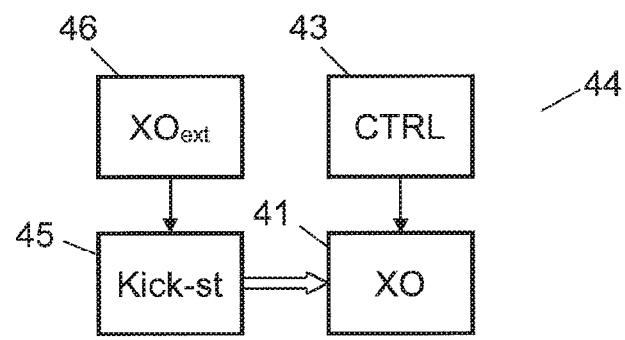
FIG. 13 shows a crystal oscillator circuit having a kick-start circuit with a dedicated oscillator that can be locked to an external reference frequency.

As shown in the crystal oscillator circuit 44 in FIG. 13, the dedicated kick-start circuit 45 may also be locked to an external source or reference 46. It can be envisioned that a mmW-based transceiver may be accompanied by other functions like traditional cellular or WiFi transceivers, localization function (e.g. GPS) etc. that may have a crystal oscillator on its own, which can then be used to act as a reference for the dedicated kick-start oscillator 45. Also in this embodiment, the control circuit 43 controls the switches $S_{1a}$, $S_{2a}$, $S_{3a}$, $S_{4a}$, $S_{1b}$, $S_{2b}$, $S_{3b}$ and $S_{4b}$ of the crystal oscillator 41, and thus also the duration of the start-up phase.

Figure 14:
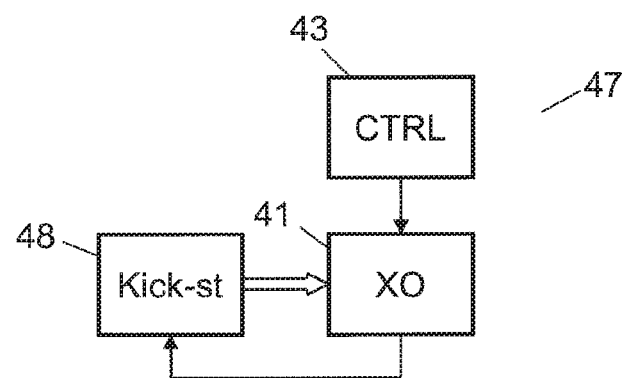
FIG. 14 shows a crystal oscillator circuit having a kick-start circuit with a free-running dedicated oscillator that can be calibrated by being phase locked to the crystal oscillator.

FIG. 14 shows an embodiment of a crystal oscillator circuit 47, in which the dedicated kick-start circuit 48 may be calibrated from the crystal oscillator 41 once or periodically to compensate for process spread and temperature to yield a more accurate frequency. Such a dedicated kick-start circuit will still be able to run at much lower power than the crystal oscillator. Also in this embodiment, the control circuit 43 controls the switches $S_{1a}$, $S_{2a}$, $S_{3a}$, $S_{4a}$, $S_{1b}$, $S_{2b}$, $S_{3b}$ and $S_{4b}$ of the crystal oscillator 41, and thus also the duration of the start-up phase.

The kick-start circuit runs over a given amount of time, e.g. determined by a given number of periods N of the kick-start outputs. This duration of the start-up phase is controlled by the control circuit 43, and later below it will be described how the duration and thus the number of kick-start pulses may be determined.

In the crystal oscillator circuits shown in FIGS. 12 to 14, the kick-start circuit and the crystal oscillator may of course be replaced by the kick-start circuit 12 and one of the crystal oscillators 11, 21 or 31 shown in FIGS. 6a, 6b, 8a, 8b, 9a or 9b, where only the transistors of the lower cross-coupled core is used for injecting kick-start pulses into the crystal.

Figure 15:
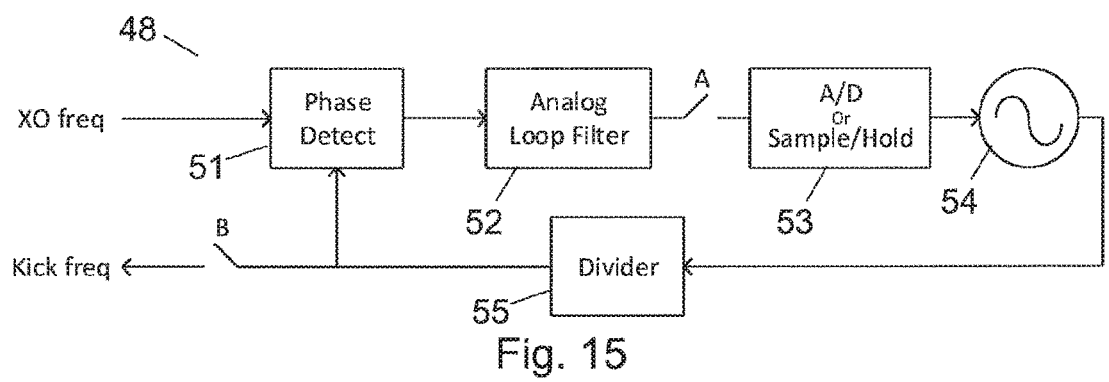
FIG. 15 shows a first embodiment of a calibrated oscillator for the kick-start circuit of FIG. 14.
Figure 16:
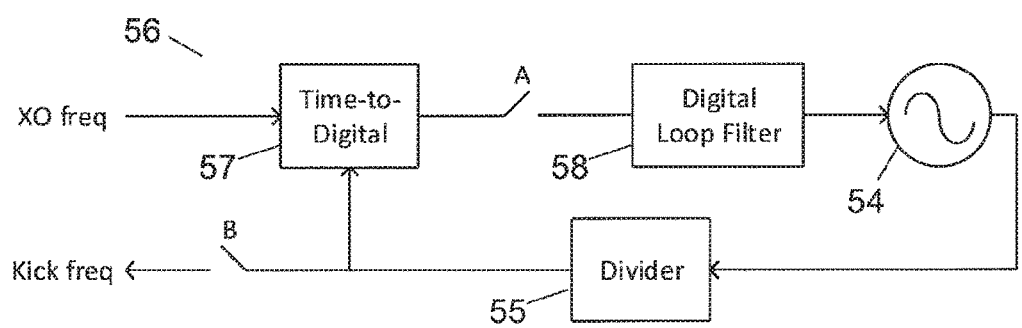
FIG. 16 shows a second embodiment of a calibrated oscillator for the kick-start circuit of FIG. 14.

A dedicated kick-start oscillator 48 can be calibrated versus the crystal frequency during time slots when the crystal oscillator 41 is turned on and in steady-state, e.g. right before the crystal oscillator is scheduled to be turned off, using a (simple) PLL structure. This is illustrated in FIGS. 15 and 16 below. At the end of such a time slot, the control input of the controlled kick-start oscillator is stored for use at a later time instance when the crystal oscillator will be turned on again. At power on of the crystal oscillator, the dedicated kick-start oscillator is operating as a free running oscillator driving the crystal oscillator core using said stored control input.

A more elaborate scheme could be to store control inputs for various operating conditions including e.g. temperature and supply voltage to be used at another time instance having an operating conditions that is similar to the one for which the control input was stored.

One embodiment of such a dedicated kick-start oscillator 48 is illustrated in FIG. 15, which shows a partly analog phase-locked loop comprising a phase detector 51, an analog loop filter 52, an analog-to-digital converter or sample/hold circuit 53, an oscillator 54, a divider 55, and two switches A and B. The control for the oscillator 54 is stored either as a digital word or as an analog sample and hold value in the analog-to-digital converter or sample/hold circuit 53. Switch A is not necessarily a physical switch, but could be a logical function. In PLL-mode, switch A is closed while switch B remains open. The A/D-converter is operating continuously and the sample and hold is a feed-through. When the loop is stable (PLL locked), the loop can be broken by opening switch A, and the result is stored in the ADC or S/H 53. During startup of the crystal oscillator, switch A remains open while switch B is closed. The duration of kick-start time, which controls switch B, is described in more detail below.

Another embodiment of such a dedicated kick-start oscillator is illustrated in FIG. 16, which shows an All-Digital phase-locked loop comprising a time-to-digital converter 57, a digital loop filter 58, the oscillator 54, the divider 55, and the two switches A and B. The control for the oscillator 54 is stored as a digital word. In PLL-mode, switch A is closed while switch B remains open.

The Digital Loop Filter is operating continuously. When the loop is stable (PLL locked), the loop can be broken by opening switch A, and the result is stored in the Digital Loop Filter 58. During startup of the crystal oscillator, switch A remains open while switch B is closed.

The accuracy of the kick-start frequency is going to be dependent on the accuracy of the digital or analog control of the kick-start-oscillator, as well as time dependent variation in voltage supply, temperature, leakage etc. The maximum drift of the crystal oscillator is also added to the total frequency error. The useful number of pulses can then be calculated vs the power off/on cycle.

Figure 17:
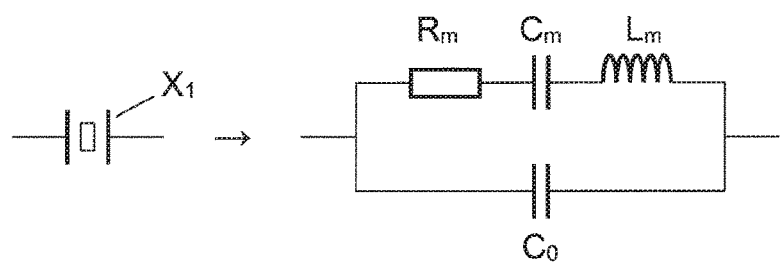
FIG. 17 shows how a crystal can be modelled electrically by a series branch in parallel with a shunt capacitance.

The oscillator circuitry shown in FIGS. 10a and 10b can also be extended to disconnect a capacitor, normally used for pulling the frequency of the crystal oscillator, during the start-up phase. FIG. 17 shows how a crystal $X_1$ can be modelled electrically by a series branch consisting of $R_m$, $C_m$, and $L_m$ in parallel with a shunt capacitance $C_0$. The series branch is also called the motional branch. By switching the crystal oscillator with the kick-start circuit as described above, a considerable part of the current will go through $C_0$, leading to a high dynamic power consumption and this makes the kick-start less power efficient as the energy provided should be delivered to the motional branch.

Further, additional capacitance $C_L$ is generally added to the outputs of the crystal oscillator (in parallel with $C_0$) to control frequency pulling of the crystal oscillator. Thus, $C_L$ will also contribute to dynamic power consumption when the crystal oscillator is driven by the kick-start circuit. FIGS. 18a and 18b show a crystal oscillator 61 where $C_L$ is disconnected during startup with switches $S_{5p}$ and $S_{5n}$ as shown in FIG. 18a. FIG. 18b shows that these switches are closed during normal operation of crystal oscillator. Otherwise, the function of this circuit is the same as illustrated in FIGS. 10a and 10b.

When the cross-coupled cores are switched by the kick-start circuit, i.e. the transistors are in the triode region and thus essentially act as switches effectively alternating the crystal terminals between ground and supply, the maximum voltage that can appear over the crystal is limited by the supply voltage. Thus, for this case the disconnection of $C_L$ will not reduce start-up time as the maximum voltage is already applied over the motional branch of the crystal. The only way to decrease the start-up time further is by increasing the voltage further.

The duration of the startup mode, i.e. the time during which the kick-start circuit injects energy into the crystal, is limited by the difference between the crystal oscillator frequency $f_{xo}$ and the kick-start output frequency $f_k$. For some embodiments, the frequency of the kick-start circuit may be different, inaccurate and/or not exactly known. We may then estimate a maximum difference between the crystal oscillator frequency and the kick-start output frequency, e.g. based on PVT (process-voltage-temperature) simulations.

Due to the difference in frequency between $f_{xo}$ and $f_k$, there will be gradual difference in phase over time between the kick-start output and the crystal oscillation. Each kick-start pulse will generate an oscillation at frequency $f_{xo}$ in the crystal with a phase related to that pulse, and thus a sequence of pulses will generate a corresponding number of oscillations, where each oscillation has a different phase shift compared to the oscillation generated by the first kick-start pulse. The resulting oscillation in the crystal will be a superposition of these oscillations, and at any time during the sequence of kick-start pulses, the phase of this resulting oscillation compared to the oscillation generated by the first kick-start pulse will be half the phase shift of the oscillation generated by the latest kick-start pulse. In other words, the phase difference between the oscillation generated by the latest kick-start pulse and the resulting (superpositioned) oscillation in the crystal will also be the half of this phase shift, and it will increase for each kick-start pulse. Therefore, there will be a maximum number of kick-start cycles, beyond which pulses will actually start to pull energy from the crystal rather than injecting energy.

From this, it can be understood that the maximum duration of the kick-start output corresponds to a maximum range of phases being 180 degrees. This is exemplified in FIG. 19, where each vector represents the phase of each kick-start output period relative to the resulting crystal oscillator output. Thus, vectors adding up constructively will obviously give net contribution whereas adding more phases outside the 180 degrees range will yield a lower total resultant.

In other words, the phase difference between any one of the kick-start pulses and the resulting crystal oscillation should not exceed 90 degrees or $\pi/2$, which means that the phase shift of the oscillation generated by the latest kick-start pulse compared to the oscillation generated by the first kick-start pulse should not exceed 180 degrees or $\pi$. The sign of this phase shift of course depends on whether the kick-start frequency $f_k$ is higher or lower than the crystal oscillator frequency $f_{xo}$.

Assuming that the kick-start output and crystal oscillator are in phase at the beginning of the startup mode (t=0) the phase difference is simply given by $2\pi|f_k-f_{xo}|t$. At some point in time $t_{max}$ this phase difference will reach $\pi$, and as described above, the kick-start output will then start pulling energy from the crystal rather than injecting it. In other words, maximum energy is injected for $2\pi|f_k-f_{xo}|t_{max}=\pi$. With $N_{max}$ being the number of kick-start output periods, this equation can also be written as $|f_k-f_{xo}|N_{max}/f_k=\frac{1}{2}$, which means that $N_{max}=f_k/(2|f_k-f_{xo}|)$.

Thus, the maximum number of kick-start pulses that can be used can be determined from the difference between the crystal oscillator frequency $f_{xo}$ and the kick-start frequency $f_k$. In some embodiments, this frequency difference may be measured and used to determine the number of pulses. However, in many situations, the solution is to estimate a maximum difference between the crystal oscillator frequency and the kick-start output frequency, e.g. based on PVT (process-voltage-temperature) simulations, and then use this estimated maximum difference for determining the number of kick-start pulses.

As described above, when the kick-start output has a frequency different from the crystal oscillator frequency there will be a burst of a maximum number of consecutive kick-start output periods that will add up constructively. When the kick-start frequency is different but accurate it is proposed to use at least one such burst. After this burst, the kick-start oscillator should, as described above, be disconnected from the oscillator circuitry, because its phase difference from the oscillation in the crystal will be too large. However, if the kick-start oscillator continues running after this first burst, there will be subsequent time instances where kick-start output and crystal oscillator output are again sufficiently aligned to add up constructively, such that additional bursts can be injected. With reference to FIG. 19, it can be seen that at any time where the phase of the kick-start output compared to the oscillation of the crystal is in the right part of the figure, i.e. the phase difference is between $-\lambda/2$ and $\pi/2$, pulses can advantageously be injected. When the phase difference is in the left half of the figure, the kick-start circuit should be disconnected from the oscillator circuitry, because its phase difference from the oscillation in the crystal will be too large. The number of bursts to use will be limited by at least one of the accuracy of frequency difference between kick-start output and crystal oscillator and the energy injection required to achieve proper crystal oscillator operation within a specified time.

Figure 20:
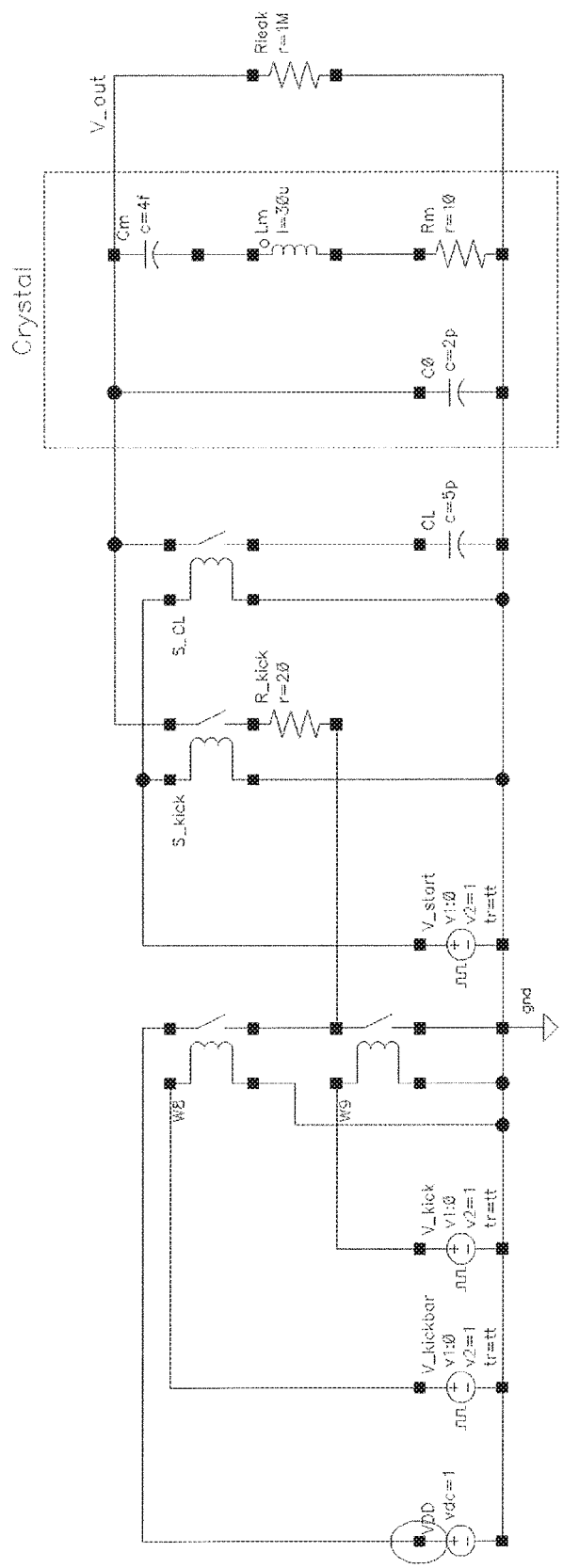
FIG. 20 shows a diagram of a basic simulation setup demonstrate the effect of the proposed solution.

To illustrate the function of the kick-start solution described above, a number of simulations have been performed. FIG. 20 shows a diagram of a basic simulation setup with linear and ideal components aimed to demonstrate the proposed solution. The schematic diagram contains the model of the crystal ($C_0$, $C_m$, $L_m$, $R_m$), the capacitor $C_L$ for pulling control, and two voltage signals V_kick and V_kickbar (having opposite phase) for generating voltage squarewaves during the startup mode to drive an ideal inverter that in turns draws current from the supply $V_{DD}$. Further, a voltage signal V_start controls the duration of the startup mode by connecting the inverter output and disconnecting $C_L$ during startup, and disconnecting inverter output and connecting $C_L$ during normal operation. Values given are hypothetical. The resonance frequency of the crystal is roughly 460 MHz. Note that this model does not include the negative resistance generated by the cross-coupled core that is used to compensate for the losses.

Simulation results are given below for various numbers of periods N to demonstrate the limit in relation to frequency difference between $f_k$ and $f_{xo}$. In the simulation results shown in FIGS. 21 to 23, the kick-start frequency is set to $f_k$=440 MHz. With $f_{xo}$=460 MHz and $f_k$=440 MHz, the maximum number of kick-start pulses N can be calculated from the equation above to be 11.

Figure 21:
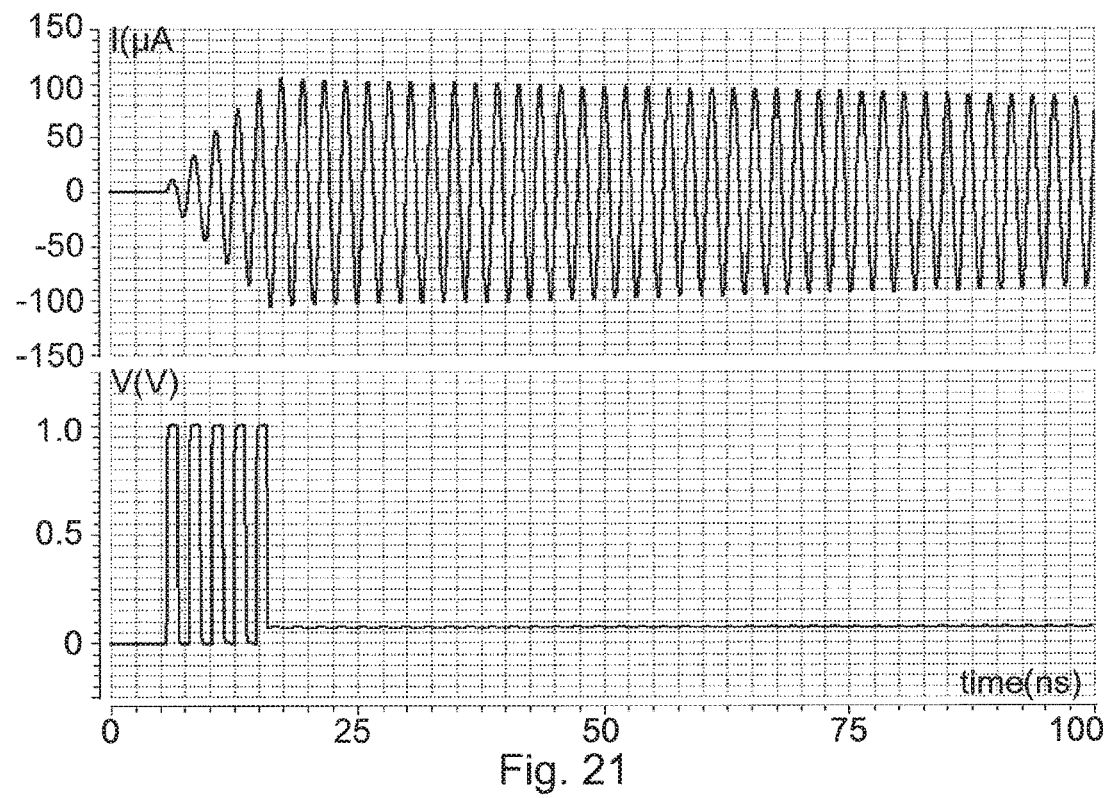
FIG. 21 shows simulation results with five injected kick-start pulses.

FIG. 21 illustrates simulated waveforms of the motional branch current, i.e. the current through $C_m$, and the output voltage, i.e. the kick-start pulses applied to the crystal, for N=5. Thus, the number of applied pulses is here less than the calculated maximum number of pulses. It can be seen that the oscillation current rapidly increases due to the energy injected into the crystal by the kick-start circuit. It is noted that since the model of FIG. 20 does not include the negative resistance generated by the cross-coupled core, the amplitude of the oscillation current decreases slightly after the kick-start phase, where in the real oscillator circuit it would increase slowly towards a stable value.

Figure 22:
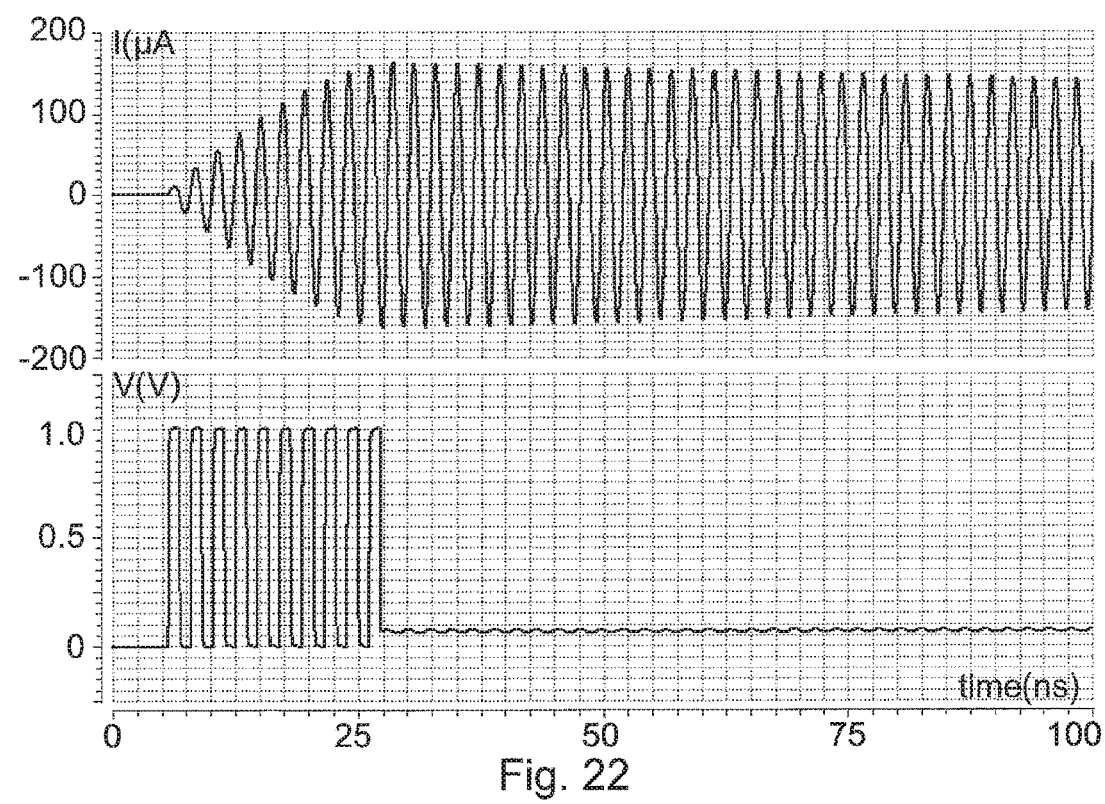
FIG. 22 shows simulation results with 10 injected kick-start pulses.

In FIG. 22, corresponding simulated waveforms are shown for N=10, i.e. the number of pulses is here close to the calculated maximum number 11. It can be seen that the oscillation current now increases to a higher value, but also that the effect of the last pulses close to the limit is less, because of the increased phase difference between the kick-start pulses and the resulting oscillation in the crystal.

Figure 23:
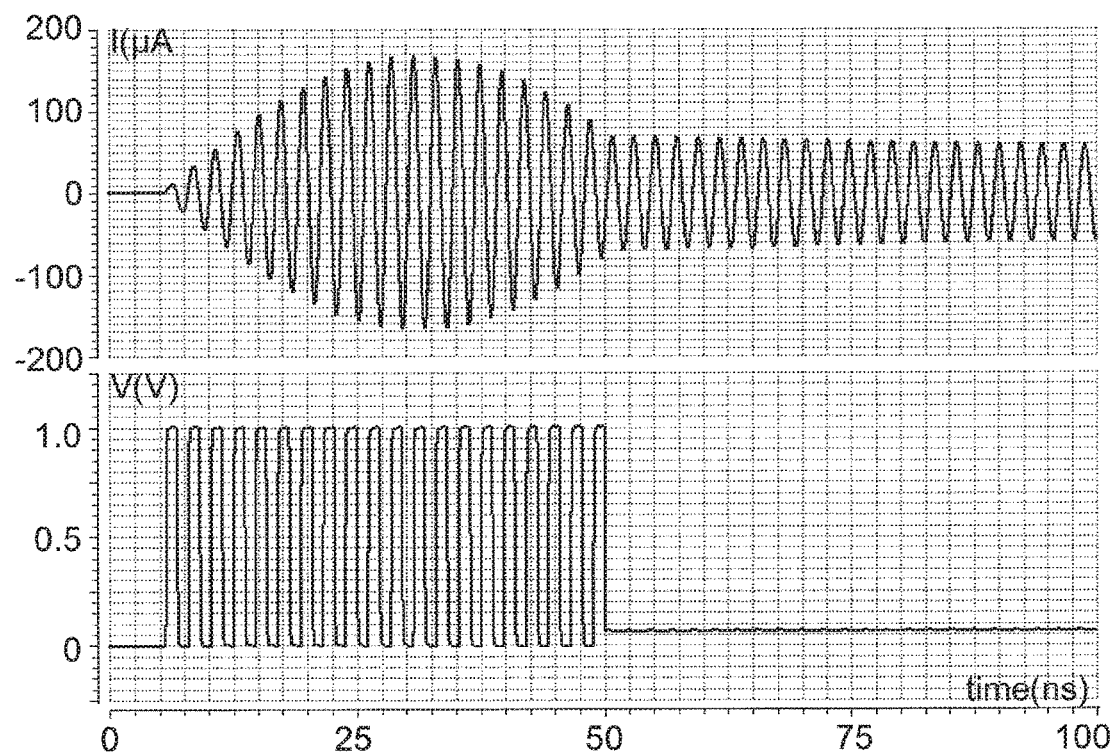
FIG. 23 shows simulation results with 20 injected kick-start pulses.

In FIG. 23, corresponding simulated waveforms are shown for N=20, i.e. the number of pulses is here considerably higher than the calculated maximum number 11. It can be seen that the oscillation current after the 11$^{th}$ pulse now decreases again, because the kick-start pulses are now too much out of phase with the oscillation in the crystal, so here N is obviously too large.

Regarding the effect of disconnecting the capacitor $C_L$ during the start-up phase, it is noted that $C_L$ is typically much larger than $C_0$ of the crystal and can amount to several pF. For example, the dynamic current consumption of 5 pF toggled between 1V and 0V at 500 MHz becomes 2.5 mA and that is comparable to the power consumption of the crystal oscillator in steady-state.

Figure 24:
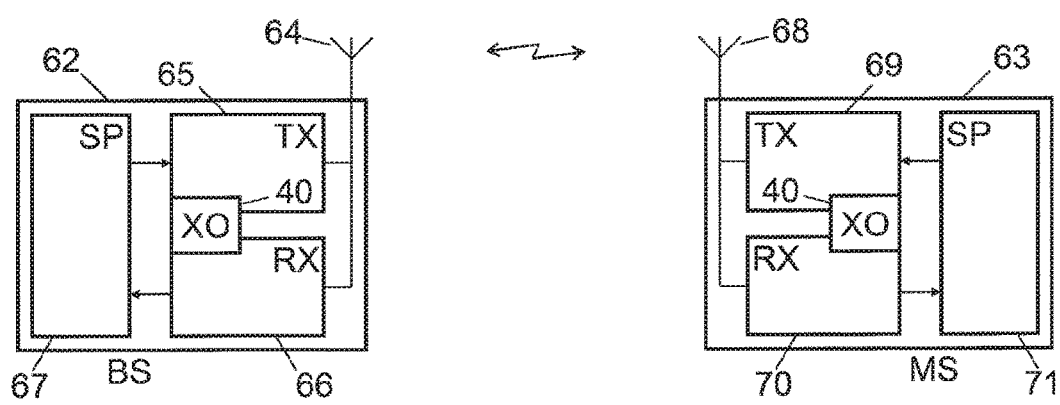
FIG. 24 shows a base station and a mobile station in which the crystal oscillator can be used.

FIG. 24 shows an example of a wireless communications system, in which a crystal oscillator circuit as described above can be used. Radio frequency signals are transmitted between two wireless communications devices, which are here exemplified by a base station 62 and a wireless terminal 63, such as a mobile phone, a machine-type communication (MTC) device, or a computer, a tablet device, or other device equipped with a cellular data modem. In the base station 62, an antenna 64 is connected to a transmitter 65 and a receiver 66, which are both connected to a signal processing unit 67. As illustrated, the base station 62 comprises a crystal oscillator circuit, e.g. the circuit 40 of FIG. 12, for providing a reference clock signal to the transmitter 65 and the receiver 66. Alternatively, there may be more than one crystal oscillator, e.g. one crystal oscillator for the transmitter 65 and one crystal oscillator for the receiver 66. Similarly, in the wireless terminal 63, an antenna 68 is connected to a transmitter 69 and a receiver 70, which are both connected to a signal processing unit 71. As illustrated, the wireless terminal 63 comprises a crystal oscillator circuit, e.g. the circuit 40 of FIG. 12, for providing a reference clock signal to the transmitter 69 and the receiver 70. Alternatively, there may be more than one crystal oscillator, e.g. one crystal oscillator for the transmitter 69 and one crystal oscillator for the receiver 70.

In other words, there is disclosed a crystal oscillator circuit 40; 44; 47 comprising a crystal $X_1$; oscillator circuitry 11; 21; 31; 41 connected to said crystal $X_1$ and configured to generate a crystal oscillation signal at an oscillation frequency; and a kick-start circuit 12; 42; 45; 48 configured to inject a number of pulses into said crystal during a start-up period of the crystal oscillator circuit. The oscillator circuitry 11; 21; 31; 41 comprises a first differential pair of transistors $M_1$, $M_2$ and is configured to operate in a selectable one of at least an oscillating mode and a start-up mode, wherein the first differential pair of transistors, in the oscillating mode, are cross-coupled so that a gate terminal of a first transistor $M_1$ of the first differential pair is coupled to a drain terminal of a second transistor $M_2$ of the first differential pair, and a gate terminal of the second transistor $M_2$ of the first differential pair is coupled to a drain terminal of the first transistor $M_1$ of the first differential pair, each one of said drain terminals of the first and second transistors of the first differential pair further being coupled to a terminal of said crystal $X_1$ to generate said crystal oscillation signal at said oscillation frequency; and said kick-start circuit 12; 42; 45; 48, in the start-up mode, is configured to drive the gate terminals of said first and second transistors $M_1$, $M_2$ Of the first differential pair with said number of pulses during said start-up period of the crystal oscillator circuit.

Oscillator circuitry with a differential pair of cross-coupled transistors allows the crystal oscillator circuit to operate at the desired high frequencies, and when start-up pulses are injected into the crystal by driving the gate terminals of the cross-coupled transistors in a start-up mode, the start-up time of the crystal oscillator circuit is substantially decreased, and parasitic oscillations in the crystal oscillator circuit can be avoided or at least considerably reduced. Decreased time for start-up leads to lower power consumption, which will be increasingly important as the frequency of the crystal oscillator approaches the GHz regime.

In some embodiments, the crystal oscillator circuit is further configured to disconnect, in the start-up mode, the gate terminal of the first transistor $M_1$ of the first differential pair from the drain terminal of the second transistor $M_2$ of the first differential pair, and the gate terminal of the second transistor $M_2$ of the first differential pair from the drain terminal of the first transistor $M_1$ of the first differential pair.

The oscillator circuitry may further comprise a second differential pair of transistors $M_3$, $M_4$, said second differential pair of transistors $M_3$, $M_4$ being complementary to the first differential pair of transistors $M_1$, $M_2$, wherein the second differential pair of transistors, in the oscillating mode, are cross-coupled so that a gate terminal of a first transistor $M_3$ of the second differential pair is coupled to a drain terminal of a second transistor $M_4$ of the second differential pair, and a gate terminal of the second transistor $M_4$ of the second differential pair is coupled to a drain terminal of the first transistor $M_3$ of the second differential pair, each one of said drain terminals of the first and second transistors of the second differential pair further being coupled to a terminal of said crystal $X_1$ to generate said crystal oscillation signal at said oscillation frequency. The use of a complementary cross-coupled differential pair of transistors reuses the same current as the first cross-coupled pair of transistors to generate negative resistance in the circuit.

In this case, said kick-start circuit 42; 45; 48 may, in the start-up mode, be configured to drive the gate terminals of said first and second transistors $M_3$, $M_4$ of the second differential pair with said number of pulses during said start-up period of the crystal oscillator circuit, and the crystal oscillator circuit may further be configured to disconnect, in the start-up mode, the gate terminal of the first transistor $M_3$ of the second differential pair from the drain terminal of the second transistor $M_4$ of the second differential pair, and the gate terminal of the second transistor $M_4$ of the second differential pair from the drain terminal of the first transistor $M_3$ of the second differential pair.

In some embodiments, each transistor $M_1$, $M_2$, $M_3$, $M_4$ of said differential pair of transistors comprises a field effect transistor.

In some embodiments, said kick-start circuit 12; 42; 45; 48 comprises an oscillator dedicated to generating said number of pulses. In such case, the dedicated oscillator may be a free-running oscillator, and the free-running oscillator may be configured to be calibrated by being phase locked to said oscillator circuitry during a time period where the oscillator circuitry is operating in the oscillating mode. In this way, a kick-start circuit having a frequency close to the target frequency of the crystal oscillator can be achieved. Alternatively, the dedicated oscillator may be configured to be locked to an external reference frequency, which also ensures a good accuracy of frequency of the kick-start circuit.

When a capacitor $C_L$ is arranged in parallel to said crystal $X_1$ for adjustment of said oscillation frequency when the oscillator circuitry is operating in the oscillating mode, the crystal oscillator circuit may further be configured to disconnect said capacitor $C_L$ from the crystal $X_1$ in the start-up mode. When the load capacitance used for pulling control and tuning is disconnected from the crystal oscillator output terminals during the start-up, it can be avoided that this capacitance sinks a large amount of current foremost yielding significant dynamic power consumption, but also effectively lowering the voltage across the crystal and thereby slowing energy injection.

In some embodiments, the crystal oscillator circuit is further configured to determine said number of pulses in dependence of a difference in frequency between a frequency of said pulses and an oscillation frequency of an oscillation generated in said crystal $X_1$ by injecting said pulses into said crystal $X_1$. In this way an optimal number of pulses, and thus an optimal duration of the start-up mode, can be determined.

The crystal oscillator circuit may be configured to determine said number of pulses so that a phase difference between each one of said pulses and the oscillation signal generated in said crystal $X_1$ by injecting that one and previous pulses of said number of pulses into said crystal $X_1$ is between $-\pi/2$ and $\pi/2$.

The crystal oscillator circuit may further be configured to inject at least a further number of pulses into said crystal $X_1$ during a further start-up period of the crystal oscillator circuit, wherein a phase difference between pulses of said further start-up period and said crystal oscillation signal is between $-\pi/2$ and $\pi/2$, said start-up periods being separated by a time period where said phase difference exceeds $\pi/2$.

An electronic apparatus may comprise at least one crystal oscillator circuit 40 as described above. In this way, the apparatus benefits from the described advantages of the crystal oscillator circuit. The electronic apparatus may be a wireless communications device comprising a receiver or a transmitter for radio frequency signals. In one embodiment, the wireless communications device is a base station 62 for a wireless communications system. In another embodiment, the wireless communications device is a mobile phone 63 for use in a wireless communications system.

As mentioned, the invention further relates to a method of reducing the duration of a start-up period for a crystal oscillator circuit 40; 44; 47 comprising a crystal $X_1$; and oscillator circuitry 11; 21; 31; 41 connected to said crystal $X_1$ and configured to generate a crystal oscillation signal at an oscillation frequency, said oscillator circuitry comprising a first differential pair of transistors $M_1$, $M_2$, wherein the first differential pair of transistors, in an oscillating mode, are cross-coupled so that a gate terminal of a first transistor $M_1$ of the first differential pair is coupled to a drain terminal of a second transistor $M_2$ of the first differential pair, and a gate terminal of the second transistor $M_2$ Of the first differential pair is coupled to a drain terminal of the first transistor $M_1$ of the first differential pair, each one of said drain terminals of the first and second transistors of the first differential pair further being coupled to a terminal of said crystal $X_1$ to generate said crystal oscillation signal at said oscillation frequency; wherein the method comprises the step of injecting from a kick-start circuit 12; 42; 45; 48 a number of pulses into said crystal $X_1$ during a start-up period of the crystal oscillator circuit, said pulses being injected by driving the gate terminals of said first and second transistors $M_1$, $M_2$ of the first differential pair with said number of pulses during said start-up period of the crystal oscillator circuit.

Oscillator circuitry with a differential pair of cross-coupled transistors allows the crystal oscillator circuit to operate at the desired high frequencies, and when a number of start-up pulses are injected into the crystal by driving the gate terminals of the cross-coupled transistors in a start-up mode, the start-up time of the crystal oscillator circuit is substantially decreased, and parasitic oscillations in the crystal oscillator circuit can be avoided or at least considerably reduced. Decreased time for start-up leads to lower power consumption, which will be increasingly important as the frequency of the crystal oscillator approaches the GHz regime.

Although various embodiments of the present invention have been described and shown, the invention is not restricted thereto, but may also be embodied in other ways within the scope of the subject-matter defined in the following claims.

The invention claimed is:

1. A crystal oscillator circuit, comprising:
    a crystal;
    oscillator circuitry connected to the crystal and configured to generate a crystal oscillation signal at an oscillation frequency; and
    a kick-start circuit configured to inject a number of pulses into the crystal during a start-up period of the crystal oscillator circuit,
    wherein the oscillator circuitry comprises a first differential pair of transistors and a second differential pair of transistors, the second differential pair of transistors being complementary to the first differential pair of transistors, and wherein the oscillator circuitry is configured to operate in a selectable one of at least an oscillating mode and a start-up mode;
    wherein the first differential pair of transistors, in the oscillating mode, are cross-coupled so that:
        a gate terminal of a first transistor of the first differential pair is coupled to a drain terminal of a second transistor of the first differential pair; and
        a gate terminal of the second transistor of the first differential pair is coupled to a drain terminal of the first transistor of the first differential pair;
        each one of the drain terminals of the first and second transistors of the first differential pair further being coupled to a terminal of the crystal to generate the crystal oscillation signal at the oscillation frequency; and
    wherein the second differential pair of transistors, in the oscillating mode, are cross-coupled so that:
        a gate terminal of a first transistor of the second differential pair is coupled to a drain terminal of a second transistor of the second differential pair; and
        a gate terminal of the second transistor of the second differential pair is coupled to a drain terminal of the first transistor of the second differential pair; and
        each one of the drain terminals of the first and second transistors of the second differential pair are coupled to a terminal of the crystal to generate the crystal oscillation signal at the oscillation frequency; and
    wherein the kick-start circuit, in the start-up mode, is configured to drive the gate terminals of the first and second transistors of the first differential pair with the number of pulses during the start-up period of the crystal oscillator circuit.

2. The crystal oscillator circuit of claim 1, wherein the crystal oscillator circuit is configured to disconnect, in the start-up mode:
    the gate terminal of the first transistor of the first differential pair from the drain terminal of the second transistor of the first differential pair; and
    the gate terminal of the second transistor of the first differential pair from the drain terminal of the first transistor of the first differential pair.

3. The crystal oscillator circuit of claim 1, wherein the kick-start circuit, in the start-up mode, is configured to drive the gate terminals of the first and second transistors of the second differential pair with the number of pulses during the start-up period of the crystal oscillator circuit.

4. The crystal oscillator circuit of claim 1, wherein the crystal oscillator circuit is configured to disconnect, in the start-up mode:
    the gate terminal of the first transistor of the second differential pair from the drain terminal of the second transistor of the second differential pair; and
    the gate terminal of the second transistor of the second differential pair from the drain terminal of the first transistor of the second differential pair.

5. The crystal oscillator circuit of claim 1, wherein each transistor of the differential pair of transistors comprises a field effect transistor.

6. The crystal oscillator circuit of claim 1, wherein the kick-start circuit comprises an oscillator dedicated to generating the number of pulses.

7. The crystal oscillator circuit of claim 6, wherein the dedicated oscillator is a free-running oscillator.

8. The crystal oscillator circuit of claim 7, wherein the free-running oscillator is configured to be calibrated by being phase locked to the oscillator circuitry during a time period where the oscillator circuitry is operating in the oscillating mode.

9. The crystal oscillator circuit of claim 6, wherein the dedicated oscillator is configured to be locked to an external reference frequency.

10. The crystal oscillator circuit of claim 1:
    further comprising a capacitor disposed in parallel to the crystal for adjustment of the oscillation frequency when the oscillator circuitry is operating in the oscillating mode;
    wherein the crystal oscillator circuit is further configured to disconnect the capacitor from the crystal in the start-up mode.

11. The crystal oscillator circuit of claim 1, wherein the crystal oscillator circuit is further configured to determine the number of pulses based on a difference in frequency between a frequency of the pulses and an oscillation frequency of an oscillation generated in the crystal by injecting the pulses into the crystal.

12. The crystal oscillator circuit of claim 11, wherein the crystal oscillator circuit is configured to determine the number of pulses so that a phase difference between each one of the pulses and the oscillation signal generated in the crystal by injecting that one and previous pulses of the number of pulses into the crystal is between $-\pi/2$ and $\pi/2$.

13. The crystal oscillator circuit of claim 12:
wherein the crystal oscillator circuit is configured to inject at least a further number of pulses into the crystal during a further start-up period of the crystal oscillator circuit, wherein a phase difference between pulses of the further start-up period and the crystal oscillation signal is between $-\pi/2$ and $\pi/2$;
wherein the start-up periods are separated by a time period where the phase difference exceeds $\pi/2$.

14. An electronic apparatus, comprising
at least one crystal oscillator circuit; wherein each of the at least one crystal oscillator circuit comprises:
a crystal;
oscillator circuitry connected to the crystal and configured to generate a crystal oscillation signal at an oscillation frequency; and
a kick-start circuit configured to inject a number of pulses into the crystal during a start-up period of the crystal oscillator circuit,
wherein the oscillator circuitry comprises a first differential pair of transistors and a second differential pair of transistors, the second differential pair of transistors being complementary to the first differential pair of transistors, and wherein the oscillator circuitry is configured to operate in a selectable one of at least an oscillating mode and a start-up mode;
wherein the first differential pair of transistors, in the oscillating mode, are cross-coupled so that:
a gate terminal of a first transistor of the first differential pair is coupled to a drain terminal of a second transistor of the first differential pair; and
a gate terminal of the second transistor of the first differential pair is coupled to a drain terminal of the first transistor of the first differential pair;
each one of the drain terminals of the first and second transistors of the first differential pair further being coupled to a terminal of the crystal to generate the crystal oscillation signal at the oscillation frequency; and
wherein the second differential pair of transistors, in the oscillating mode, are cross-coupled so that:
a gate terminal of a first transistor of the second differential pair is coupled to a drain terminal of a second transistor of the second differential pair; and
a gate terminal of the second transistor of the second differential pair is coupled to a drain terminal of the first transistor of the second differential pair; and
each one of the drain terminals of the first and second transistors of the second differential pair are coupled to a terminal of the crystal to generate the crystal oscillation signal at the oscillation frequency; and
wherein the kick-start circuit, in the start-up mode, is configured to drive the gate terminals of the first and second transistors of the first differential pair with the number of pulses during the start-up period of the crystal oscillator circuit.

15. The electronic apparatus of claim 14, wherein the electronic apparatus is a wireless communications device comprising a receiver and/or a transmitter for radio frequency signals.

16. The electronic apparatus of claim 15, wherein the wireless communications device is a base station for a wireless communications system.

17. The electronic apparatus of claim 15, wherein the wireless communications device is a mobile phone for use in a wireless communications system.

18. A crystal oscillator circuit, comprising:
a crystal;
oscillator circuitry connected to the crystal and configured to generate a crystal oscillation signal at an oscillation frequency; and
a kick-start circuit configured to inject a number of pulses into the crystal during a start-up period of the crystal oscillator circuit,
wherein the oscillator circuitry comprises a first differential pair of transistors and is configured to operate in a selectable one of at least an oscillating mode and a start-up mode;
wherein the first differential pair of transistors, in the oscillating mode, are cross-coupled so that:
a gate terminal of a first transistor of the first differential pair is coupled to a drain terminal of a second transistor of the first differential pair; and
a gate terminal of the second transistor of the first differential pair is coupled to a drain terminal of the first transistor of the first differential pair;
each one of the drain terminals of the first and second transistors of the first differential pair further being coupled to a terminal of the crystal to generate the crystal oscillation signal at the oscillation frequency; and
wherein the kick-start circuit, in the start-up mode, is configured to drive the gate terminals of the first and second transistors of the first differential pair with the number of pulses during the start-up period of the crystal oscillator circuit, wherein the kick-start circuit comprises an oscillator dedicated to generating the number of pulses, and wherein the dedicated oscillator is configured to be locked to an external reference frequency.

19. An electronic apparatus, comprising
at least one crystal oscillator circuit; wherein each of the at least one crystal oscillator circuit comprises:
a crystal;
oscillator circuitry connected to the crystal and configured to generate a crystal oscillation signal at an oscillation frequency; and
a kick-start circuit configured to inject a number of pulses into the crystal during a start-up period of the crystal oscillator circuit,
wherein the oscillator circuitry comprises a first differential pair of transistors and is configured to operate in a selectable one of at least an oscillating mode and a start-up mode;
wherein the first differential pair of transistors, in the oscillating mode, are cross-coupled so that:
a gate terminal of a first transistor of the first differential pair is coupled to a drain terminal of a second transistor of the first differential pair; and
a gate terminal of the second transistor of the first differential pair is coupled to a drain terminal of the first transistor of the first differential pair;

each one of the drain terminals of the first and second transistors of the first differential pair further being coupled to a terminal of the crystal to generate the crystal oscillation signal at the oscillation frequency; and wherein the kick-start circuit, in the start-up mode, is configured to drive the gate terminals of the first and second transistors of the first differential pair with the number of pulses during the start-up period of the crystal oscillator circuit, wherein the kick-start circuit comprises an oscillator dedicated to generating the number of pulses, and wherein the dedicated oscillator is configured to be locked to an external reference frequency.

* * * * *